United States Patent [19]

Acuff et al.

[11] Patent Number: 4,771,428
[45] Date of Patent: Sep. 13, 1988

[54] CIRCUIT TESTING SYSTEM

[75] Inventors: Mark W. Acuff, Hillsboro; Nam Tosuntikool, Beaverton, both of Oreg.

[73] Assignee: Cadic Inc., Beaverton, Ohio

[21] Appl. No.: 850,058

[22] Filed: Apr. 10, 1986

[51] Int. Cl.$^4$ ............................................. G01R 31/28
[52] U.S. Cl. .................................. 371/25; 324/73 R
[58] Field of Search .................. 371/20, 25, 1, 27, 15, 371/16; 324/73 R, 73 AT

[56] References Cited

U.S. PATENT DOCUMENTS

| | | | |
|---|---|---|---|
| 3,976,940 | 8/1976 | Chau | 371/25 X |
| 4,055,801 | 10/1977 | Pike | 371/25 X |
| 4,066,882 | 1/1978 | Esposito | 324/73 R |
| 4,125,763 | 11/1978 | Drabing et al. | 324/73 R |
| 4,168,527 | 9/1979 | Winkler | 364/580 |
| 4,168,796 | 9/1979 | Fulks et al. | 324/73 R |
| 4,194,113 | 3/1980 | Fulks et al. | 371/20 |
| 4,308,615 | 12/1981 | Koegel et al. | 371/20 |
| 4,433,414 | 2/1984 | Carey | 371/25 X |
| 4,497,056 | 1/1985 | Sugamori | 371/1 X |
| 4,517,661 | 5/1985 | Graf et al. | 364/900 |
| 4,646,299 | 2/1987 | Schinabeck | 371/25 X |

Primary Examiner—Jerry Smith
Assistant Examiner—Robert W. Beausoliel
Attorney, Agent, or Firm—Foley & Lardner, Schwartz, Jeffery, Schwaab, Mack, Blumenthal & Evans

[57] ABSTRACT

The present invention includes a device for providing connections to a plurality of inputs of a circuit to be tested. A computer stores test vectors comprising data representing stimulus signals to be applied to the circuit and data representing response signals to be sensed from the circuit. The stored test vectors are applied through a driver associated with each input of the circuit to be tested. The driver has an output capable of assuming a high state, a low state or a floating state. A driver control causes the driver to assume a high or low output state in response to data representing stimulus signals and causes the driver output to assume a floating state in response to data representing response signals. Response signals from the device to be tested are compared to the data representing response signals to determine the occurrence of a fault.

14 Claims, 6 Drawing Sheets

4,771,428

CIRCUIT TESTING SYSTEM

BACKGROUND OF THE INVENTION

1. Field of the Invention

The present invention relates to the field of circuit testers and particularly to systems for testing digital integrated circuits.

2. Discussion of Related Art

Modern integrated circuits are very complex in nature. The testing of the electrical characteristics of these circuits is of critical importance in order to ensure reliability. However, because of the complex nature of integrated circuits and because of the constant improvement of circuits and development of new circuits, testing to ensure good quality control can be a very difficult and complex problem.

Various circuit testers have been suggested. For example, U.S. Pat. No. 4,517,661 to Graf et al shows a programmable chip tester having plural pin unit buffers which each store sufficient test data for independent operations by each pin unit.

U.S. Pat. No. 4,066,882 to Esposito shows a digital stimulus generating and response measuring system.

U.S. Pat. No. 4,125,763 to Drabing et al shows an automatic tester for microprocessor boards.

U.S. Pat. No. 4,168,527 to Winkler shows an analog and digital circuit tester.

U.S. Pat. No. 4,168,796 to Fulks et al shows a portable tester for testing a variety of printed circuit boards without utilizing specialized adaptor boards for rerouting input test signals and supply voltages from the tester to various pins of the board under test.

U.S. Pat. No. 4,194,113 to Fulks et al shows a method and apparatus for isolating faults in digital printed circuit boards under test.

U.S. Pat. No. 4,308,615 to Koegel et al discloses an apparatus for use in automatic testing of elements in data processing systems.

SUMMARY OF THE INVENTION

One object of the present invention is to provide a device which can be used in combination with a conventional personal computer to provide a highly sophisticated and versatile testing system for digital circuits.

Another object of the present invention is to provide a system for testing a plurality of different integrated circuits without the need for a special wiring harness for each circuit tested.

Yet another object of the present invention is to provide a testing system for digital circuits which is capable of providing stimulus signals to the device under test and monitoring response signals to detect errors using a minimum number of components.

Another object of the present invention is to provide a testing system for digital circuits in which the functioning of the device is modified automatically to compensate for different loading on channels being stimulated.

In accordance with the above and other objects, the system of the present invention comprises structure for providing connections to a plurality of inputs of a circuit to be tested and a device for storing test vectors comprising data representing stimulus signals to be applied through the connections and response signals to be sensed through the connections. The invention applies the stored test vectors to the connections using a driver associated with each input of the circuit to be tested. Each driver has an output capable of assuming a high state, a low state, or a floating state. A driver control receives data indicative of the test vectors and controls the driver to assume a high or low output state in response to stimulus signal data, and to assume a floating state in response to response signal data. Furthermore, the response signals from the connections are compared to response signal data to determine a fault.

In accordance with other aspects of the invention, the driver may be a tri-statable device having a data input for receiving stimulus data and a control input for causing the driver output to float or to assume a high or low state in response to the driver data input.

In accordance with other aspects of the invention, the driver control comprises a register for storing stimulus and response signal data and connected to the data input of the driver. In addition, the driver control comprises a status register connected to the control input for applying control data for causing said driver output to float or respond to said driver data input.

Further, the comparison between a response signal from the device under test and response signal data may be performed in a comparator having a first input connected to the output of the register for storing stimulus and response data, and having a second input connected to the circuit to be tested.

Furthermore, an adjustable clock may be provided for controlling the timing between the application of stimulus data to the driver data input, and application of control data from the status register to the driver.

BRIEF DESCRIPTION OF THE DRAWINGS

The above and other objects of the present invention will become more readily apparent as the invention becomes more fully understood from the detailed description to follow, reference being had to the accompanying drawings in which like reference numerals represent like parts throughout, and in which.

DETAILED DESCRIPTION OF THE PREFERRED EMBODIMENT

Figure 1:
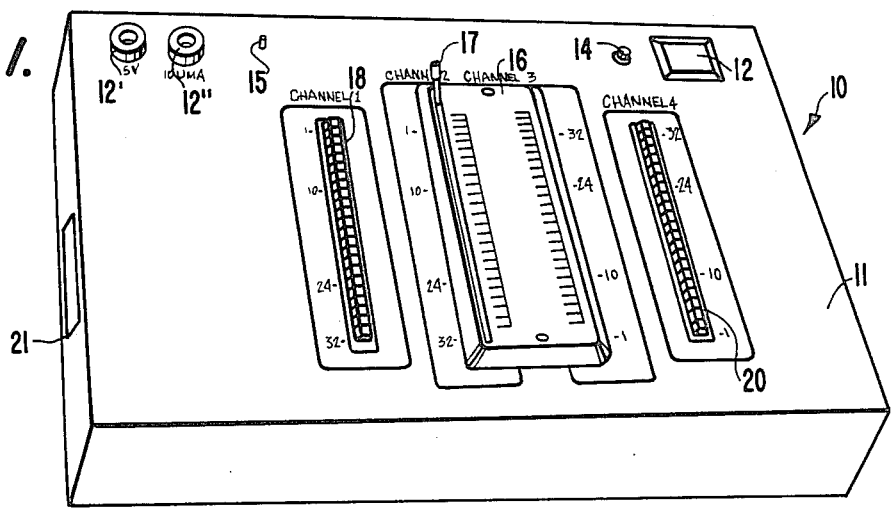
FIG. 1 is a perspective view of a first embodiment of the digital testing apparatus of the present invention.
Figure 2:
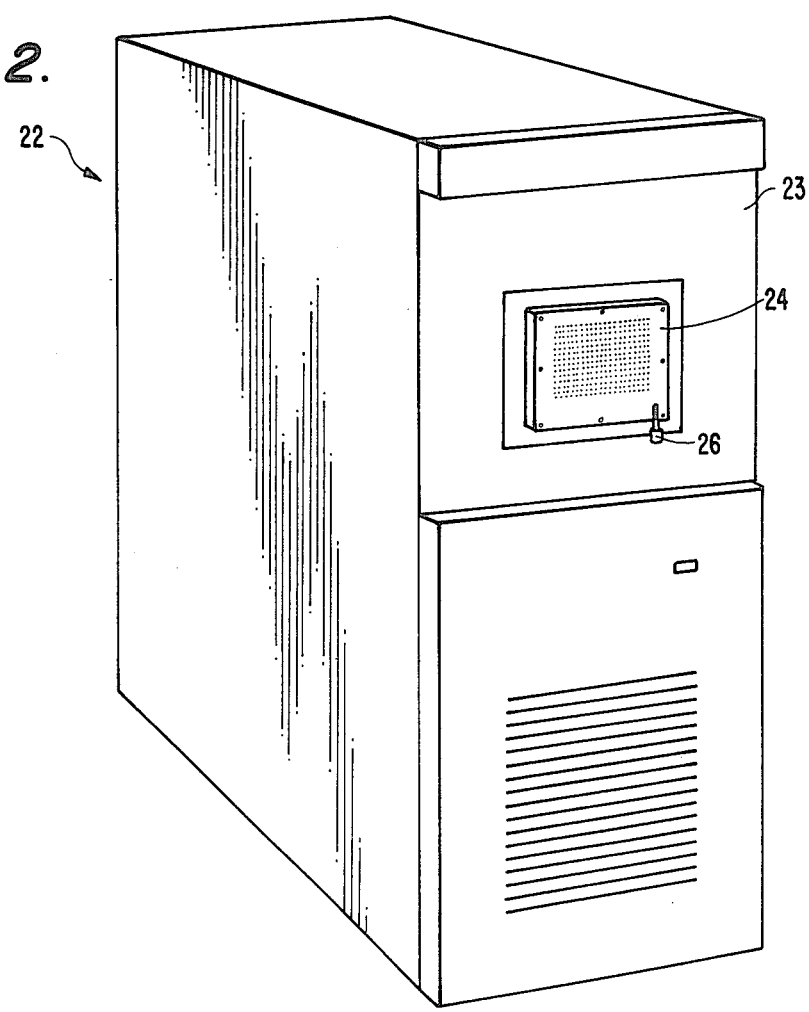
FIG. 2 is a perspective view of a second embodiment of a digital testing apparatus according to the present invention.

FIG. 1 shows a digital testing apparatus 10 which comprises a housing 11 having a rocker-type on/off switch 12. Next to the rocker switch 12 is an indicator light 14 for indicating when the power to the unit has been turned on. To the left of indicator light 14 is a reset switch 15 for placing all of the tri-statable devices of the unit (to be discussed below) in their tri-state condition, ready to accept programming of new test data. Positive and negative terminals 12 and 12' of a five volt power supply are also provided for supplying power to a device under test.

The front panel of housing 11 contains four rows of 32 pins marked as channels 1-4. The pins are also marked as to their sequential position in the row for pins 1, 10, 24 and 32. Each pin is individually accessible using a spring loaded test probe or jumper wires fitted with square pin female connector hardware. A 64 pin zero insertion force socket 16 is provided for connection to channels 2 and 3. This socket may be a conventional socket as provided by Textool. Socket 16 is fitted over the pins of channels 2 and 3 and may be actuated by movement of a lever 17.

The pins 18 of channel 1 and pins 20 of channel 4 remain exposed for connection to ribbon cable, spring loaded test probes or the like.

A 25 pin D-type connector port 21 is provided for connection to a personal computer by cable.

A second testing apparatus 22 has a housing 23 and contains a single zero insertion force socket 24 operated by lever 26. Testing apparatus 22 is slightly larger than testing apparatus 10 and is more versatile, as will be discussed below.

Adaptor cards, as will be discussed below, are provided for connection to zero insertion force sockets 16 or 24 to enable testers 10 and 22 to easily test 3/10" or 6/10" dual in-line packs or to test circuits contained in plastic leadless chip carriers.

Figure 3:
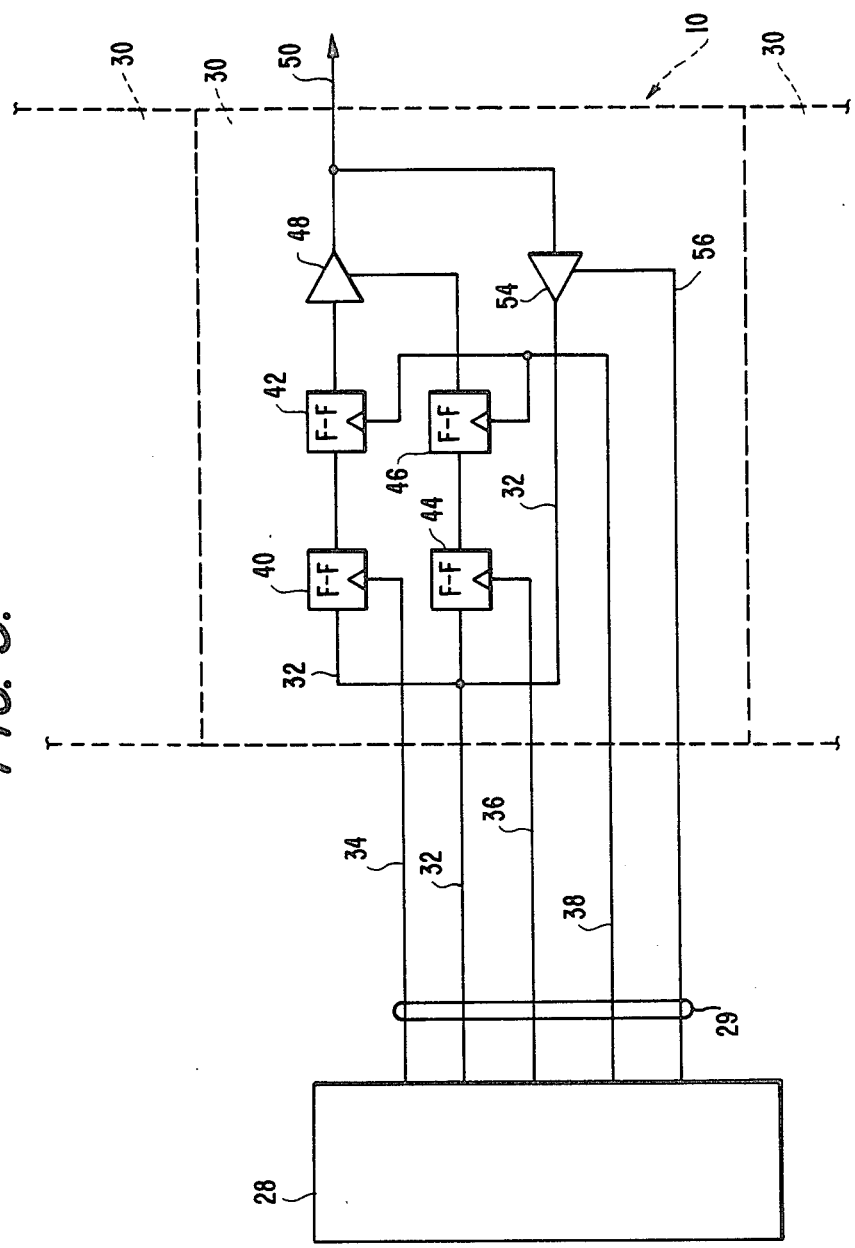
FIG. 3 is a block diagram showing the logic circuitry of the digital testing apparatus of FIG. 1.

FIG. 3 shows the testing apparatus 10 connected to a personal computer 28. Computer 28 may be any conventional computer such as an IBM PC, PCXT or PCAT. Cable 29 connects the computer 28 to the testing apparatus 10.

Testing apparatus 10 has a plurality of logic circuits 30. One logic circuit is associated with each of the pins of the channels 1, 2, 3 and 4. Only one logic circuit 30 is shown in detail in FIG. 3.

Cable 29 contains a bi-directional data line 32, a stimulus load timing line 34, a status load timing line 36, a clock line 38, and a response status line 56. The bi-directional data line 32 is connected to the data input of flip-flop 40 which has an output connected to the data input of a flip-flop 42. Line 32 is also connected to the input of a flip-flop 44 which has its output connected to the input of a flip-flop 46. The output of flip-flop 42 connects to the data input of a tri-statable driver 48 and the output flip-flop 46 is connected to a control input of tri-statable driver 48. The output of driver 48 is connected to output line 50 which is connected to one of the pins of channels 1, 2, 3 or 4.

Tri-statable driver 48 can be any conventional driver which has a control input determining whether its output is floating or responsive to the input. In the case of tri-statable driver 48, if an output of flip-flop 46 is high, the output on line 50 of driver 48 responds to the input of driver 48 from flip-flop 42. Thus, if flip-flop 42 has high output, the signal on line 50 is also high. If the output of flip-flop 42 is low, the output on line 50 is also a low. If the output of flip-flop 46 is low, the output of driver 48 on line 50 is floating.

Line 50 is bi-directional so that both stimulus and response signals may be present. Line 50 leads to the input of a second tri-statable device 54 which has its output on line 32 and has its control input connected to line 56.

In operation, a conventional test vector file for the device under test is loaded into computer 28 and used to drive circuit 30. Flip-flops 40 and 42 act as a stimulus register for providing stimulus signals to tri-statable device 48. Flip-flops 44 and 46 form a status register for storing control signals for tri-statable device 48. Computer 28 loads flip-flops 40 and 44 with the first stimulus and status signals, respectively, by clocking the appropriate data into flip-flops 40 and 44 using timing lines 34 and 36. Line 38 is then driven high to transfer the data from flip-flops 40 and 44 to flip-flops 42 and 46. If circuit 30 is to be used as a stimulus channel, the output from flip-flop 46 at this time will be a one signal causing driver 48 to drive line 50 with the same signal as is output from flip-flop 42. At the same time, line 56 is driven low by computer 28 to enable line 32 to be under the control of the computer in order for new data to be presented to flip-flops 40 and 44.

Conversely, if line 50 is to receive a response from the device under test, the output of flip-flop 46 is driven low so as to enable line 50 to be under the control of the device under test. At the same time, line 56 is driven high by the computer so that the response signal on line 50 is transferred to line 32.

As can be understood from the foregoing, the software used to drive a particular circuit 30, could easily be generated by one of ordinary skill in the art. The software reads the vector for the test pin connected to that circuit 30 and drives the circuit so as to provide either a stimulus whereby line 50 is driven to the level of the stimulus signal, or to transmit a response from line 50 to the computer through line 32.

Figure 4:
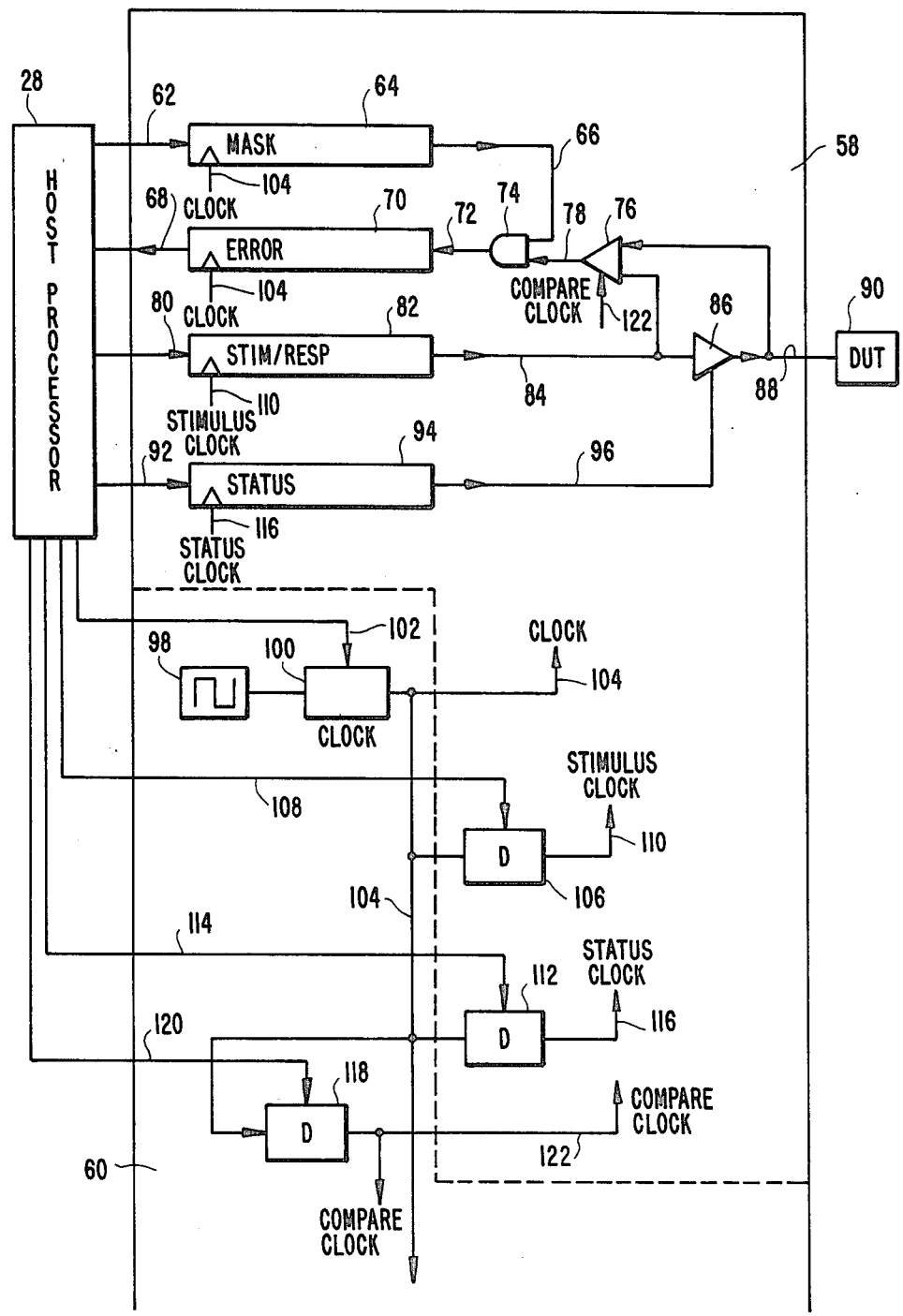
FIG. 4 is a block diagram showing the logic circuitry of the digital testing apparatus of FIG. 2.

FIG. 4 shows the logic circuit for testing apparatus 22. In FIG. 4, a single circuit 58 is disclosed, it being understood that a separate circuit 58 is provided for each socket contact of socket 24. In addition, FIG. 4 shows timing circuitry 60 which is common to all of the logic circuits 58.

Logic circuit 58 is connected to a mask data line 62 which is connected to an input of a shift register 64 which stores mask information. The output of shift register 64 is connected to a line 66 which is also connected to one input of an AND gate 74. An error data line 68 is connected between an error shift register 70 and the host computer 28. The input of error shift register 70 is received on line 72 from the output of AND gate 74. A second input to AND gate 74 is received from a comparator 76 on line 78.

A stimulus/response data line 80 is connected from computer 28 to the input of a stimulus/response shift register 82. The output of shift register 82 is passed along line 84 to the input of tri-statable device 86. Line 84 is also connected to one input of comparator 76. The output of tri-statable driver 86 is connected to line 88 which leads to one pin of the device under test 90 and which also leads to a second input of comparator 76.

A status data line 92 is connected from host computer 28 to a status shift register 94. The output of register 94 is connected to a line 96 which is also connected to the control input of tri-statable driver 86.

The timing circuitry 60 contains an oscillator 98 which has its output connected to a control circuit 100. Circuit 100 operates under direct control of the computer through a line 102. The output of control circuit 100 is a clock signal on line 104. Control circuit 100 contains essentially a programmable divider for controlling the frequency of the clock signal on line 104 as well as the number of clock pulses output onto line 104.

Line 104 is connected to the input of a delay module 118. Module 118 delays any clock pulses received on line 104 by an amount commanded by the computer 28 through line 120 and passes the delayed clock pulses to a compare clock line 122. Accordingly, the pulses on clock line 104 and the compare clock pulses on line 122 are provided to each of the logic circuits 58.

In logic circuit 58, the clock pulses on line 104 are provided to the clock input of shift register 64 and shift register 70. The clock pulses on line 104 are also provided to a delay module 106 which delays these pulses by an amount controlled by computer 28 through line 108, and passes the delay clock pulses through a line 110 to the clock input of shift register 82.

The clock pulses on line 104 are also provided to a delay module 104 which is under the control of computer 28 through a line 114. The delayed pulses from module 112 are passed through line 116 to the clock input of shift register 94.

The compare clock pulses on line 122 are passed to the control input of comparator 76. Accordingly, the comparator 76 is operative to compare the signals on lines 84 and 88 at the active edge of each compare clock pulse received on line 122.

In operation, the stimulus/response register 82 and status register 94 are loaded by the computer. The stimulus clock delay 106 is controlled to be less than the status clock delay 112 so that a signal from register 82 is provided on line 84 before the control input of tri-statable driver 86 receives a signal from status register 94. If the signal from register 82 is intended to be a stimulus signal, the output of status register 94 will be high causing the signal on line 84 to be transmitted to line 88 and to the device under test 90. In this case, at the leading edge of the compare clock pulse 122, the stimulus signal on line 84 is compared to the signal on line 88 to ensure that the proper stimulus signal is provided to the device under test 90.

If logic circuit 58 is to receive a response from device under test 90, the status register 94 outputs a low level signal. In this case, the response from the device under test 90 is transmitted along line 88 to comparator 76 and the response data signal from register 82 is transmitted along line 84 to comparator 76. Upon the rising edge of a compare clock pulse, comparator 76 compares the response signal with the response data signal and outputs the result on line 78.

In the case where a "don't care" condition exists, mask register 64 will provide a low level signal to AND gate 74 so as to block the result of the comparison on line 78 from reaching error register 70. In this situation, no errors will be detected. In the case where errors are to be detected, the mask register is loaded with ones so that gate 74 will always pass an error signal when it is generated.

The programmable delay modules 106, 112 and 118 enable the relationship between the clock pulses on line 104, the stimulus clock pulses on line 110, the status clock pulses on line 116, and the compare clock pulses on line 122 to be altered within limits. The clock pulses 104 will always occur first so that any mask data from register 64 will be provided to AND gate 74 and any errors produced by a previous comparison will be entered into register 70. The stimulus and status clocks will then occur to set the state of driver 86 and provide the stimulus or response data from register 82. The compare clock will occur last to ensure that the signals on lines 84 and 88 are valid before a comparison is carried out. The result of the comparison will then be entered into error register 70 upon the occurrence of the next clock pulse.

The variability of the delays solves several problems. As the loading of a given stimulus channel is increased, the propagation delay generated by tri-statable driver 86 increases. Therefore, the device under test receives this stimulus at a later time. This has the effect of removing some of the time that was alloted for the device under test response pins to settle to their valid states. By moving the compare clock pulses on line 122 to a point in time where no errors occur on the stimulus pins, the effect of loading can be nullified. Accordingly, differences in part to part delay characteristics exhibited by the components of circuit 58 can be nullified. This provides concurrent stimuli on all channels driving the device under test. Also, differences in stimuli delay due to non-uniform capacitive loading of the device under test may be nullified within limits. This is the case where one or more pins of the device under test present a greater load than the others. The result is stimulus skew that may be nullified by skewing stimulus and status clocks.

In addition, the variable delays allow the user to skew stimuli by a known amount in the interest of checking the characteristics of the device under test such as data setup and hold times.

Figure 5A:
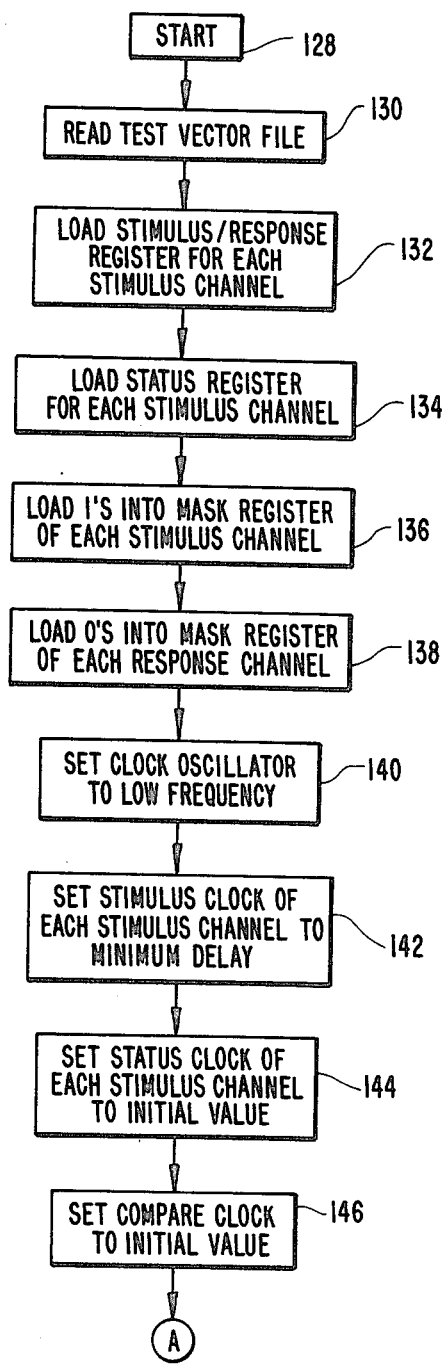
FIGS. 5a and 5b show a flow chart depicting the autocalibration routine of the present invention.
Figure 5B:
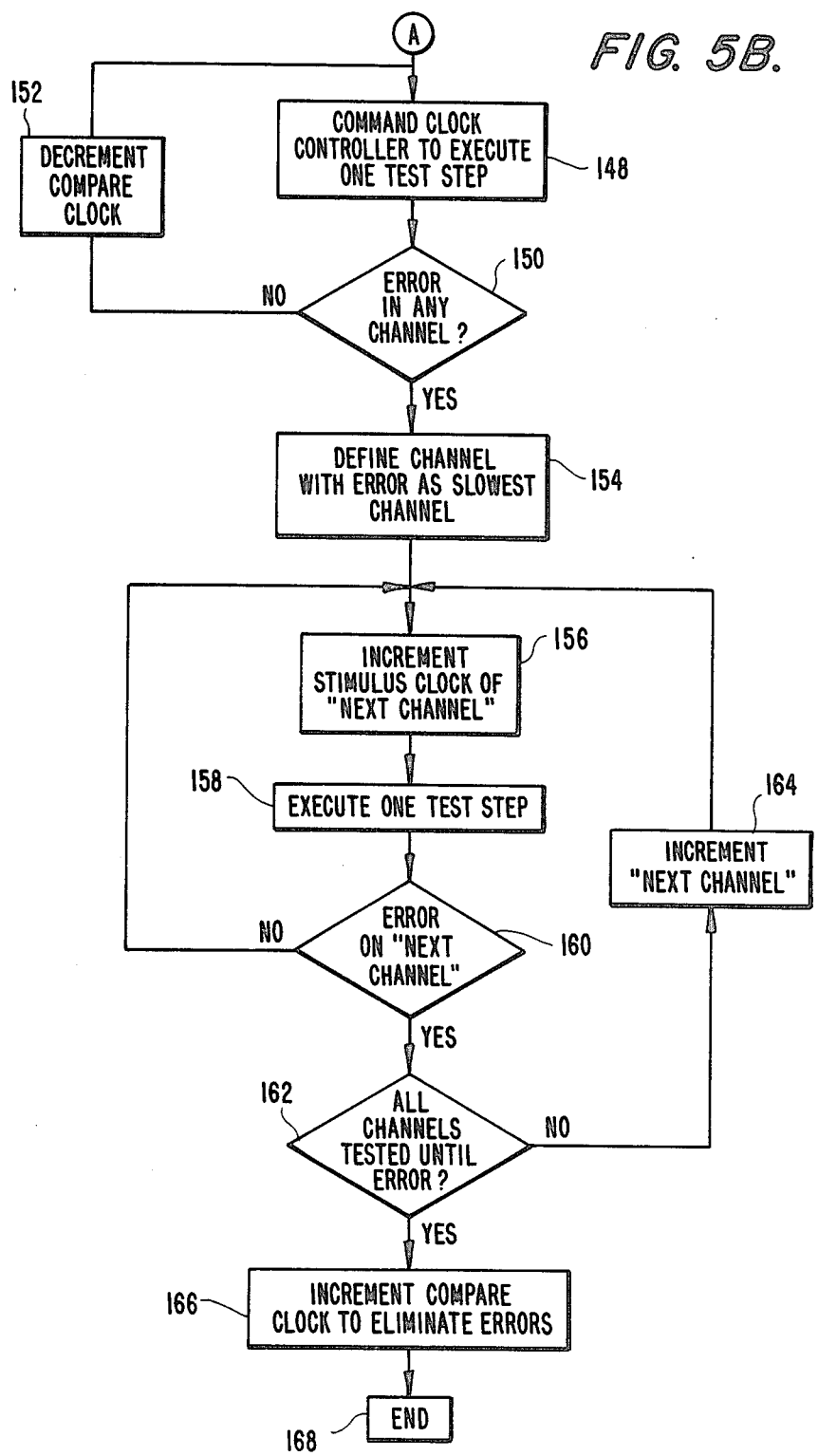

The present invention includes an autocalibration program for setting the delays 106, 112 and 118 of the stimulus channels. FIGS. 5a and 5b show a flow chart for the autocalibration program.

The program is entered at step 128 and control passes to step 130 where the test vector file for the device under test is read. The input statement of this file identifies the stimulus pins of the device under test.

In step 132, the software loads the stimulus/response register 82 with data from the corresponding column of the test vector file for each stimulus channel.

In step 134, the status register 94 is loaded with 1's to cause each stimulus channel to drive the device under test.

In step 136, the mask register 64 for each stimulus channel is loaded with 1's so that no errors are masked in the stimulus channels. In step 138, the mask register 64 of each response channel is loaded with 0's to mask all errors in the response channels.

Once the registers are loaded, an initialize procedure begins with step 140 where programmable control block 100 is set to provide a clock signal at a relatively low frequency. This allows for a large initial setting of delay 118 which is common to all channels.

In step 142, delay 106 for the stimulus clock of each stimulus channel is set to a minimum delay so that the stimulus data is provided relatively quickly after the clock signal occurs. In step 144, the status clock delay 112 is set to some initial value for each stimulus channel. The initial value may be the same delay time as set in delay 106. In step 146, the compare clock delay in block 118 is set at a initial value which is relatively high so that the compare clock occurs at a point in time where no error signal due to loading by the device under test is expected.

Once the initial values of all delays are set, the software identifies the slowest channel starting with step 148 in which the clock controller is commanded to execute one test step. In step 150, the contents of the error register 70 are clocked into the computer to determine whether any error has occurred in a stimulus channel. If no error has occurred, control passes to step 152 where the delay set in compare clock delay module 118 is decremented by a preset amount. Control then passes to step 148 again where another test step is executed. This procedure continues until an error is developed in a stimulus channel. Step 154 then defines this channel as the slowest channel; in other words, the channel having the greatest loading effect on its tri-statable driver 86.

At this point, the program aligns the other channels with the slowest channel starting with step 156 in which the computer increments the stimulus clock delay 106 of the "next channel". In other words, the channel next to the slowest channel is incremented. In step 158, one test step is executed and in step 160, the error register 70 of the "next channel" is accessed to determine whether an error has occurred. If no error has occurred, control passes to step 156. Steps 156 and 158 are repeated until an error has occurred. In this case, control passes from 160 to step 162 where the computer checks to see whether all channels have been tested until an error has occurred. If not, control passes to step 164 where the "next channel" is incremented. These steps are repeated until each channel registers an error. At this time, control passes to step 166 where the compare clock delay 118 is incremented to eliminate all errors. Accordingly, this procedure sets the compare clock delay 118 at a "compare reference" for the device under test. This is the smallest value that can be used by the compare clock and have no errors generated by any of the stimulus channels. Also, the stimulus clocks of the channels have now been set such that a valid signal on line 88 of each channel will have been attained at approximately the same time. Thus, concurrent stimuli are provided on all channels driving the device under test.

Figure 6:
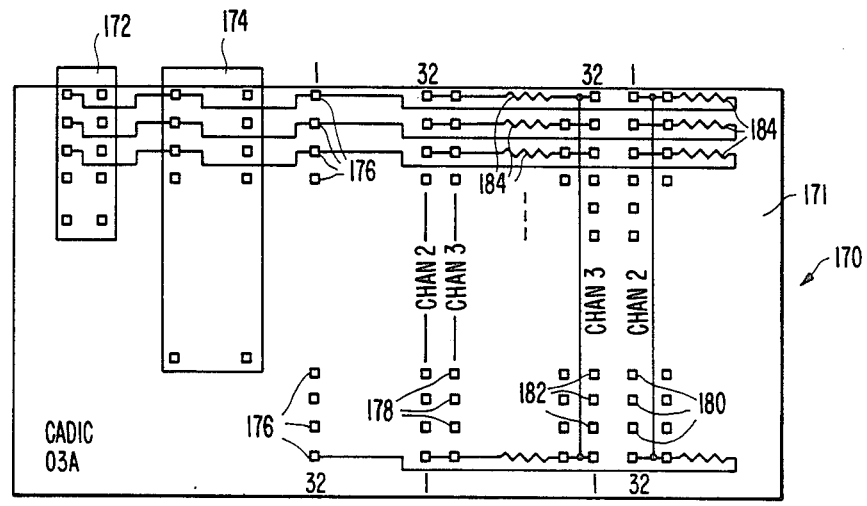
FIG. 6 is a schematic representation showing a first adaptor card for use with the present invention.
Figure 7:
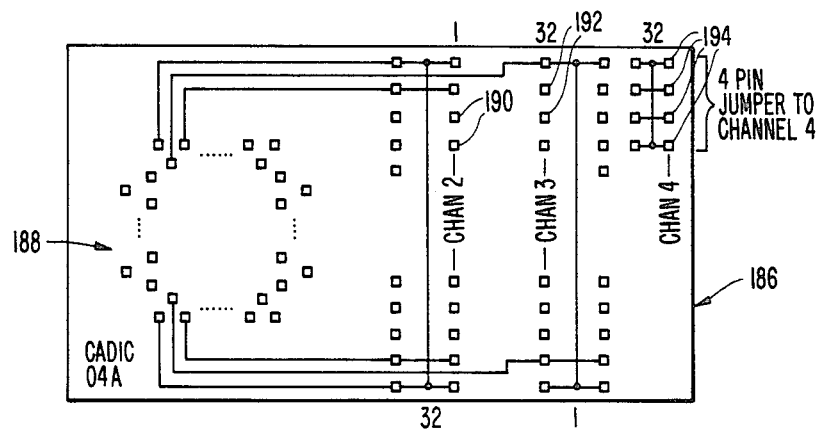
FIG. 7 is a schematic representation showing a second adaptor card for use with the present invention.

In order to accommodate different devices to be tested, the present invention includes adaptor cards such as those shown in FIGS. 6 and 7. FIG. 6 shows a top plan schematic view of an adaptor card designed to fit into the socket 16 of testing apparatus 10. A similar adaptor card can be used in socket 24 of testing apparatus 22. Adaptor card 170 includes zero insertion force socket 172 which can be a Textool Model 220-3342 socket. This socket will receive 3/10" dual in-line packs. Socket 172 is mounted directly on a printed circuit board 171 of the adaptor card 170.

A second zero insertion force socket 174 is also mounted on printed circuit board 171. Socket 174 can receive 6/10" dual in-line packages.

A plurality of pins 176 extend downwardly from the printed circuit board 171 and align with the socket contact of socket 16 forming channel 2 of the testing apparatus 10 shown in FIG. 1. Likewise, a plurality of pins 178 extend downwardly from printed circuit board 170 to align with the socket contacts forming channel 3 of the socket 16. Accordingly, adaptor 170 can be plugged directly into socket 16 of FIG. 1. The socket contacts of sockets 172 and 174 are connected, respectively, to pins 176 and 178.

In order to provide versatility, a plurality of upwardly extending pins 180 and 182 are provided on the printed circuit board 171. These pins are connected, respectively, to the pins 176 and 178 through 100 ohm series damping resistors 184. Pins 180 and 182 can be connected to a ribbon cable, autoprober or the like.

FIG. 7 shows a second adaptor card 186 which can be used to test device packages in 28 pin plastic leadless chip carriers. In this case, a mount such as a Textool Model 228-5523 is directly attached to the printed circuit board at position 188. The leads from this mount are connected to downwardly extending pins 190 and 192. In addition, it may be necessary to connect some of the leads to pins other than those leading to channels 2 and 3. In this case, a plurality of upwardly extending pins 194 is provided. A jumper in the form of a ribbon cable is connected from pins 194 to four of the pins 20 of channel 4 of the testing apparatus 10 of FIG. 1.

In order to use the present invention, a software file must be created indicating where the device under test is connected to the testing apparatus. Here, the discussion relates to testing apparatus 10 although the discussion is equally applicable to testing apparatus 22. To demonstrate the formation of an appropriate data file, it will be assumed that adaptor card 170 is connected to the zero insertion force socket 16 of testing apparatus 10. In this case, sockets 172 and 174 are available for use. Socket 172 can handle 6, 8, 14, 16, 18 and 20 pin dual in-line parts. Assuming that the user is testing an 8 pin dual in-line part, the part will be inserted into the top of the 20 pin socket 172 and will use the top four pins on the left hand side of the socket, and the top four pins on the right hand side of the socket. Adaptor card 170 uses channel 2 for all of the pins on the 20 pin socket 172. The pin numbering is counterclockwise beginning with channel 2, pin 1 and ending with channel 2, pin 20. The part will use on the left hand side of the socket channel 2, pin 1; channel 2, pin 2; channel 2, pin 3; and channel 2, pin 4. On the right hand side of the socket channel 2, pin 17; channel 2, pin 18; channel 2, pin 19; and channel 2, pin 20 will be used. The user will indicate this sequence in an appropriate software file for the computer to read. The file contains many sets of data, each labeled by an identifying header. In this example, the data file can be identified by the key word PKGNAME and something to identify the particular part being tested such as, "X-18 pin,". The data file would appear as follows:

PKGNAMEX18PIN
2-1 2-2 2-3 2-4
2-17 2-18 2-19 2-20
The example above is read as follows:

Channel 2, pin 1 corresponds to data column 1;
Channel 2, pin 2 corresponds to data column 2;
Channel 2, pin 3 corresponds to data column 3;
Channel 2, pin 4 corresponds to data column 4;
Channel 2, pin 17 corresponds to data column 5;
Channel 2, pin 18 corresponds to data column 6;
Channel 2, pin 19 corresponds to data column 7;
Channel 2, pin 20 corresponds to data column 8.

The vector file for the device under test is formatted with one column for each pin of the device. The columns are then associated with the pins of CHANNELS 1 through 4 of apparatus 10 using the above file.

A similar file is produced and stored for each device to be tested. In this manner, it is not necessary to hard wire a separate test setup for each part to be tested. The testing apparatus, the adaptor card and software can easily be modified to handle any device to be tested.

The foregoing description is set forth for the purpose of illustrating the present invention but is not deemed to limit it in any way. Clearly, numerous additions, substitutions and other modifications can be made to the invention without department from the scope thereof as set forth in the appended claims.

What is claimed is:
1. A system for testing circuits, comprising:
  means for providing connections to a plurality of pins of a circuit to be tested, comprising a socket having a plurality of socket connectors which may be greater in number than said pins of said circuit to be tested;

means for storing a test vector comprising data columns representing stimulus signals to be applied through said connections to said circuit to be tested, and for storing data representing response signals to be sensed through said connections;

means for providing an operator variable indication of which socket connectors are used by the circuit to be tested and correspondence between said columns of said test vector and said socket connectors;

means for applying said stored test vectors to said connections, comprising: a driver associated with each pin of said circuit to be tested, said driver having an output capable of assuming a high state, a low state, or a floating state; and driver control means responsive to said providing means and said storing means for controlling said driver with a variable timing controlled by software to assume a high output state or a low output state in response to data representing stimulus signals and to assume a floating state in response to data representing response signals;

means for receiving response signals from said device to be tested and comparing said response signals to said data representing response signals to determine a fault.

2. A system as set forth in claim 1 wherein said driver has a data input for receiving data representing stimulus signals, and a control input for receiving control signals for causing said driver output to assume a floating state or to assume a high or low state in response to said driver data input.

3. A system as set forth in claim 2 wherein said driver control means comprises a stimulus/response register for storing stimulus and response signal data and having an output connected to said data input, and a status register connected to said control input for storing said control signals, and wherein said comparing means comprises a comparator having a first input connected to said stimulus/response register and having a second input connected to said circuit to be tested.

4. A system as set forth in claim 1, wherein said means for providing connections comprises at least one zero insertion force socket.

5. A system as set forth in claim 1 wherein said means for storing test vectors comprises a computer.

6. A system for testing circuits, comprising:
means for providing connections to a plurality of pins of a circuit to be tested;
means for storing a test vector comprising data representing stimulus signals to be applied through said connections to said circuit to be tested, and for storing data representing response signals to be sensed through said connections;
means for applying said stored test vectors to said connections, comprising:
a driver associated with each pin of said circuit to be tested, said driver having an output capable of assuming a high output state, a low output state, or a floating state, wherein said driver has a data input for receiving data representing stimulus signals, and a control input for receiving control signals for causing said driver output to assume said floating state or to assume said high or low state in response to said driver data input; and
driver control means responsive to said storing means to apply said control signals and said stimulus signals to said driver with a variable timing controlled by software to assume said high output state or said low output state in response to data representing stimulus signals and to assume said floating state in response to data representing response signals, wherein said driver control means comprises a stimulus/response register for storing stimulus and response signal data and having an output connected to said data input, and a status register connected to said control input for storing said control signals;

means for receiving response signals from said device to be tested and comparing said response signals to said data representing response signals to determine a fault, comprising a comparator having a first input connected to said stimulus/response register and having a second input connected to said circuit to be tested;

a first clock for controlling application of data representing stimulus signals from said stimulus/response register to said driver data input; and a second clock for controlling application of control signals from said status register to said driver control input.

7. A system as set forth in claim 6 including means for controlling the relative timing of said first and second clocks.

8. A system as set forth in claim 6 including means for controlling the timing of comparisons made by said comparing means, and means for varying the relative timing of said first and second clocks and said comparison timing means based on a load applied by the device to be tested.

9. A system for testing circuits, comprising:
means for providing connections to a plurality of pins of a circuit to be tested;
means for storing a test vector comprising data representing stimulus signals to be applied through said connections to said circuit to be tested, and for storing data representing response signals to be sensed through said connections;
means for applying said stored test vectors to said connections, comprising:
a driver associated with each pin of said circuit to be tested, said driver having an output capable of assuming a high output state, a low output state, or a floating state, wherein said driver has a data input for receiving data representing stimulus signals, and a control input for receiving control signals for causing said driver output to assume said floating state or to assume said high or low state in response to said driver data input; and
driver control means responsive to said storing means to apply said control signals and said stimulus signals to said driver for controlling said driver with a variable timing controlled by software to assume said high output state or said low output state in response to data representing stimulus signals and to assume said floating state in response to data representing response signals, wherein said driver control means comprises a stimulus/response register for storing stimulus and response signal data and having an output connected to said data input, and a status register connected to said control input for storing said control signals;
means for receiving response signals from said device to be tested and comparing said response signals to said data representing response signals to determine a fault, comprising a comparator having a first input connected to said stimulus/response register and having a second input connected to said circuit to be tested;

a register for storing error indications produced by said comparing means; and means for selectively masking error indications from said comparing means.

10. A method for testing a circuit, comprising:

providing connections to a plurality of pins of a circuit to be tested;

storing test vectors comprising data representing stimulus signals to be applied through said connections and response signals to be sensed through said connections;

providing an operator variable table of correspondence between said test vector data and said connections;

applying said stored test vectors to said connections in accordance with the table of correspondence by controlling a driver associated with each pin of the circuit to be tested with a variable timing controlled by software to produce a high or low output state in response to data representing stimulus signals applied to an input of said driver and to assume a floating output state in response to data representing response signals to be sensed through said connections; and receiving response signals from said connections in accordance with the table of correspondence when said driver is in said floating output state and comparing said response signals to said data representing response signals to determine a fault.

11. A method for testing a circuit, comprising:

providing connections to a plurality of pins of a circuit to be tested;

storing test vectors comprising data representing stimulus signals to be applied through said connections and response signals to be sensed through said connections;

applying said stored test vectors to said connections by controlling a driver associated with each pin of the circuit to be tested with a variable timing controlled by software to produce a high or low output state in response to data representing stimulus signals applied to an input of said driver and to assume a floating output state in response to data representing response signals to be sensed through said connections; and receiving response signals from said connections when said driver is in said floating output state and comparing said response signals to said data representing response signals to determine a fault;

sensing the load on said driver by determining the time required for the output of said driver to reach a commanded state; and adjusting the timing of said comparing state so as to execute said comparing step only when a valid signal is on the output of said driver.

12. A method according to claim 11 wherein said adjusting step is carried out by adjusting the timing of said comparator to execute said comparing step at a maximum time delay from the time at which said driver is intended to assume one of said high and low output states, and reducing said time delay until an invalid signal appears on said driver output.

13. A system for testing circuits, comprising:

means for providing connections to a plurality of pins of a circuit to be tested;

means for storing a test vector comprising data representing stimulus signals to be applied through said connections to said circuit to be tested, and for storing data representing response signals to be sensed through said connections;

means for applying said stored test vectors to said connections, comprising: a driver associated with each pin of said circuit to be tested, said driver having an output capable of assuming a high state, a low state, or a floating state; and driver control means responsive to said storing means for controlling said driver with a variable timing controlled by software to assume a high output state or a low output state in response to data representing stimulus signals and to assume a floating state in response to data representing response signals;

means for receiving response signals from said device to be tested and comparing said response signals to said data representing response signals to determine a fault; and means for sensing a load on said driver by determining the time required for an output of said driver to reach a command state, and adjusting a timing of said receiving and comparing means so as to compare said response signals to said data representing response signals only when a valid signal is received on the output of said driver.

14. An apparatus according to claim 13 including means for adjusting the timing of said comparison of said response signals to said data representing response signals such that said comparison is carried out at a maximum delay time from the time at which said driver is intended to assume one of said high and low output states, and reducing said time delay until an invalid signal appears on said driver output.

* * * * *